United States Patent
Costrini et al.

(10) Patent No.: US 6,743,642 B2
(45) Date of Patent: Jun. 1, 2004

(54) BILAYER CMP PROCESS TO IMPROVE SURFACE ROUGHNESS OF MAGNETIC STACK IN MRAM TECHNOLOGY

(75) Inventors: Gregory Costrini, Hopewell Junction, NY (US); John Hummel, Millbrook, NY (US); Kia-Seng Low, Hopewell Junction, NY (US); Mahadevaiyer Krishnan, Hopewell Junction, NY (US)

(73) Assignees: International Business Machines Corporation, Armonk, NY (US); Infineon AG, Munich (DE)

( * ) Notice: Subject to any disclaimer, the term of this patent is extended or adjusted under 35 U.S.C. 154(b) by 28 days.

(21) Appl. No.: 10/289,488

(22) Filed: Nov. 6, 2002

(65) Prior Publication Data

US 2004/0087038 A1 May 6, 2004

(51) Int. Cl.$^7$ ................................................ H01L 21/00
(52) U.S. Cl. ........................................... 438/3; 438/692
(58) Field of Search ......................... 438/3, 680, 681, 438/683, 687, 692

(56) References Cited

U.S. PATENT DOCUMENTS

| | | | |
|---|---|---|---|
| 5,496,759 A | 3/1996 | Yue et al. | |
| 5,702,831 A | 12/1997 | Chen et al. | |
| 6,004,188 A | 12/1999 | Roy | |
| 6,205,052 B1 | 3/2001 | Slaughter et al. | |
| 6,217,416 B1 | 4/2001 | Kaufman et al. | |
| 6,365,419 B1 | 4/2002 | Durlam et al. | |
| 6,677,631 B1 * | 1/2004 | Drewes | 257/295 |

* cited by examiner

Primary Examiner—David Nhu
(74) Attorney, Agent, or Firm—Margaret A. Pepper

(57) ABSTRACT

A method for manufacturing a magnetoresistive random access memory (MRAM) cell is disclosed, which alleviates the problem of Neel coupling caused by roughness in the interface between the tunnel junction layer and the magnetic layers. The method includes depositing first and second barrier layers on the conductor, wherein the first barrier layer has a polish rate different from that of the second barrier layer. The second barrier layer is then essentially removed by chemical mechanical polishing (CMP), leaving a very smooth and uniform first barrier layer. When the magnetic stack is then formed on the polished first barrier layer, interfacial roughness is not translated to the tunnel junction layer, and no corruption of magnetization is experienced.

10 Claims, 4 Drawing Sheets

US 6,743,642 B2

BILAYER CMP PROCESS TO IMPROVE SURFACE ROUGHNESS OF MAGNETIC STACK IN MRAM TECHNOLOGY

FIELD OF THE INVENTION

This invention relates generally to the manufacture of magnetoresistive random access memory (MRAM) cells. More particularly, this invention relates to a method of manufacturing such MRAM cells using a bilayer CMP process to improve the interficial roughness between magnetic layers.

BACKGROUND OF THE INVENTION

Magnetoresisteive random access memory (MRAM) has the advantages of non-volatility, capability of three-dimensional cell packing, low power consumption, simpler and cheaper process compared to conventional DRAM and FLASH memory. The architecture for MRAM comprises a plurality or array of memory cells and a plurality of digit and bit line intersections. The MRAM cell generally used is composed of a magnetic tunnel junction (MTJ), and isolation transistor, and the intersection of digit and bit lines. An interconnect stack connects the isolation transistor to the MTJ device, to the bit line, and to the digit line used to create part of the magnetic field for programming the MRAM cell.

MRAM uses the relative orientation of the magnetization in ferromagnetic materials to store information. Optimal performance of magneto-resistive tunnel junction devices requires smooth tunnel barriers. The relative orientation of the magnetization can be corrupted by surface roughness. This corruption of the magnetization is known as "Neel coupling," and is the remnant magnetism due to the roughness of the interfacial surface as shown in FIG. 1. A rough tunnel barrier induces Neel coupling which, in effect creates an offset in the switching field of the magneto-resistive device thereby reducing the operating margin of the device in a memory array. In addition, there may be a possibility of metal shorting through the tunneling junction during magnetic stack deposition when the tunneling junction thickness is in the order of the surface roughness. In practice such roughness occurs despite the use of chemical mechanical polishing (CMP) of the substrate prior to deposition of the magnetic tunnel junction metal stack.

The degree of smoothness following CMP is dependent on the type of material used for the barrier layer. The term barrier here refers to the diffusion resistance of this layer to metallic contamination from the wiring conductor. This distinguishes the function of this barrier layer from the device electron tunnel barrier. One common material for the barrier layer is tantalum nitride (TaN). Other common materials are ruthenium (Ru), tantalum (Ta) and titanium nitride (TiN) implemented as single layers or also in combination to achieve the smooth interfaces to eliminate the deleterious effect of Neel coupling.

One practical ramification of the buffer layer used beneath the metal stack is that it must be removed during the device patterning to isolate the devices. In general it is difficult to etch TaN, for example with high selectivity to an underlying dielectric material or also any exposed copper used in the wiring level below the magnetoresistive device. In addition, it is difficult to uniformly polish a thin metal layer to achieve both a smooth surface and commensurately a uniform remaining thickness over the wafer surface.

Thus, there is a need in the art for a method of manufacturing MRAM cells which minimizes such surface roughness and therefore eliminates the Neel coupling and metal shorting problems described above. There is also a need in the art for a process that provides a smooth surface while reducing the non-uniformity of the remaining metal thickness.

SUMMARY OF THE INVENTION

The problems described above are addressed through use of the present invention, which is directed to a method for fabricating a magnetoresistive random access memory cell, comprising the steps of providing a semiconductor substrate including at least one conductor embedded in a dielectric material, the top surface of the conductor being coplanar with the top surface of the dielectric material, depositing a first material on the conductor and the dielectric material; depositing a second material on the first material, wherein the second material has a polish rate faster than the first material; essentially removing the second material by chemical mechanical polishing; depositing a first magnetic layer stack, a non-magnetic tunnel junction barrier layer, and a second magnetic layer; and patterning the first material, the first magnetic layer stack, the non-magnetic tunnel junction barrier layer, and the second magnetic layer by a lithographic process.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Figure 1A:
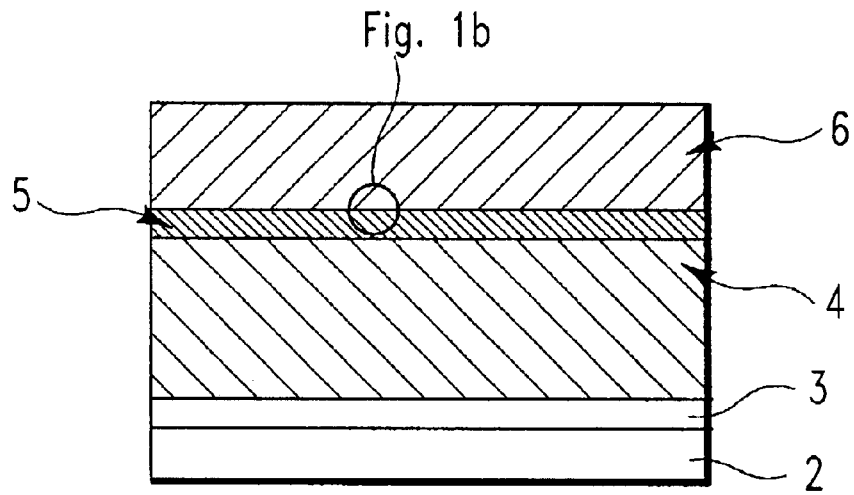
FIGS. 1(a)–1(b) are schematic cross-sectional views of a partially-fabricated MRAM cell showing the corruption of relative orientation of magnetization caused by interfacial roughness.
Figure 1B:
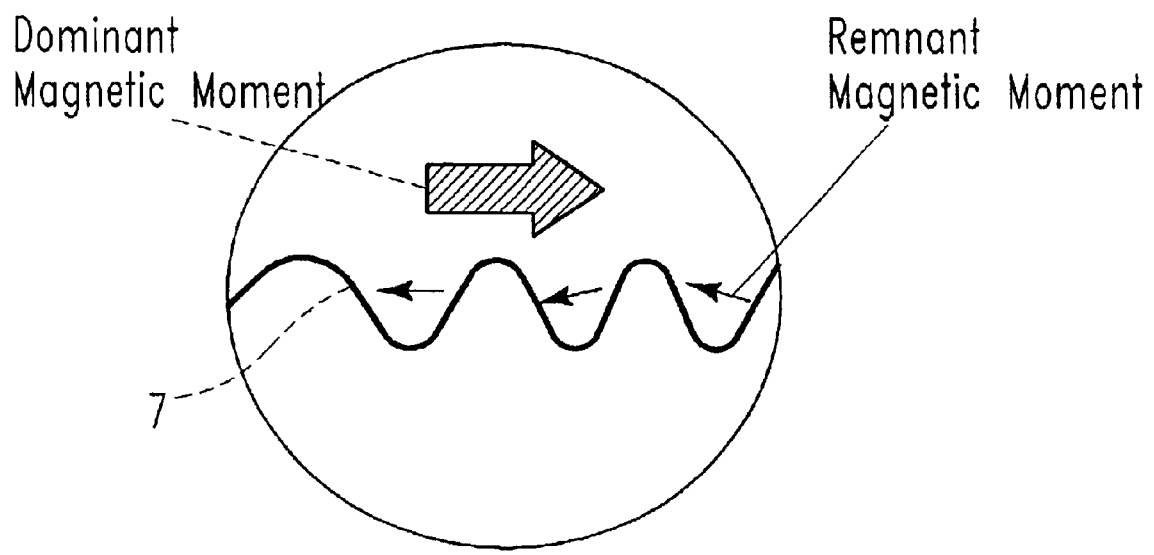

FIG. 1(a) illustrates a partially-fabricated MRAM cell showing the corruption of relative orientation of magnetization caused by interfacial roughness. Specifically, FIG. 1(a) shows a partially-fabricated MRAM cell which includes non-magnetic conductor 2 forming a lower electrode for the MRAM cell, and further includes barrier layer 3, pinned magnetic layer 4, non-magnetic tunnel barrier layer 5, and free magnetic layer 6. The surface of tunnel barrier layer 5 often suffers from interfacial roughness 7. The corruption of magnetization caused by such roughness is known as "Neel coupling," and results in a Remnant Magnetic moment misaligned to the orientation of the Dominant Magnetic moment, as shown in FIG. 1(b). This Neel coupling in effect creates an offset in the switching field of the magneto-resistive device thereby reducing the operating margin of the device in a memory array.

Figure 2A:
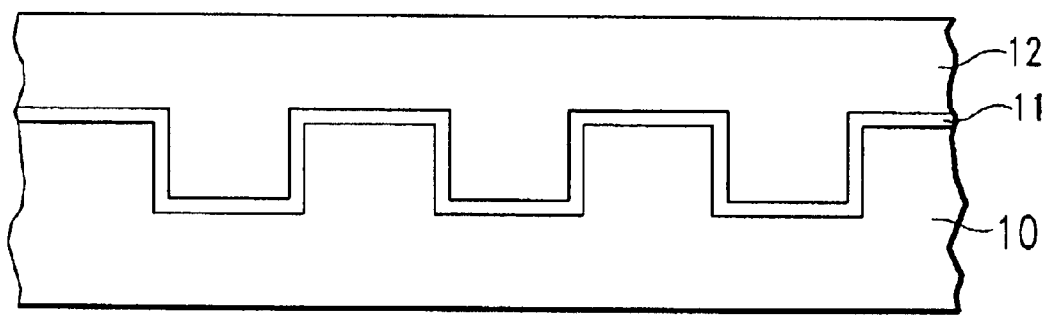
FIGS. 2(a)–2(d) illustrate a prior art method for forming a MRAM cell.

Such interfacial roughness can occur despite the use of CMP polishing of the substrate prior to deposition of the magnetic tunnel junction metal stack. A typical manufacturing process for a magnetic tunnel junction metal stack is shown in FIGS. 2(a)–2(e). FIG. 2(a) shows a partially-fabricated metal stack in which dielectric layer 10 is patterned and etched to form trenches, the trenches are lined with liner material 11, and then conductive material 12 is deposited. Conductive material 12 is typically copper, and liner material II may be TaN.

Figure 2B:
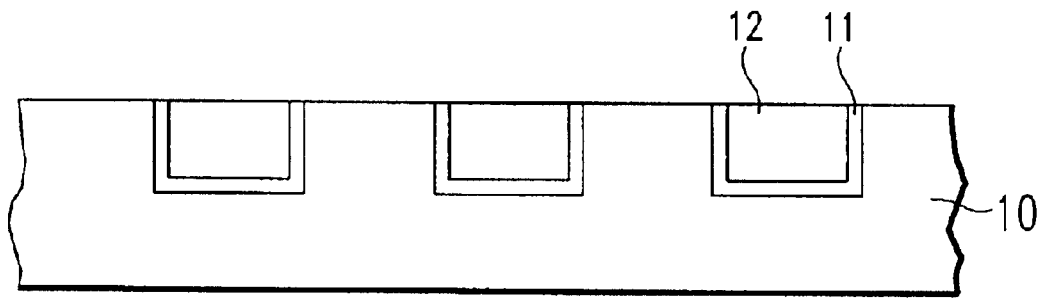
Figure 2C:
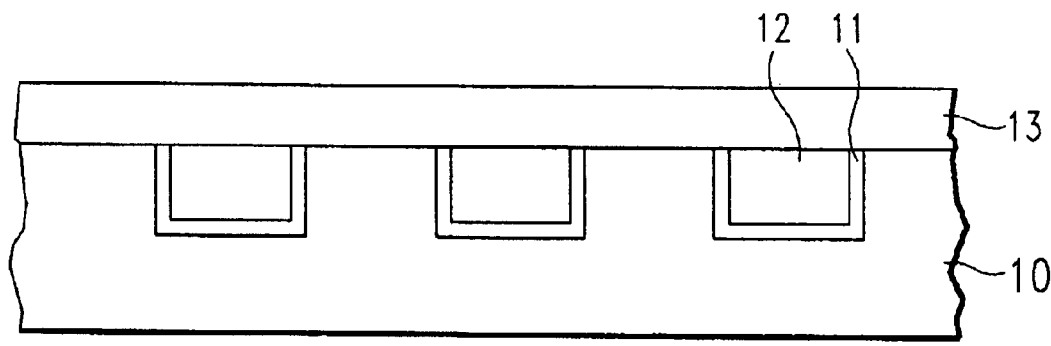

FIG. 2(b) shows the partially-fabricated metal stack after excess conductive material 12 and liner material 11 are removed by CMP polishing. In FIG. 2(c), barrier layer 13 is blanket deposited on dielectric material 10 and conductors 12. Barrier layer 13 is typically TaN, and is typically about 500 Å thick as deposited.

Figure 2D:
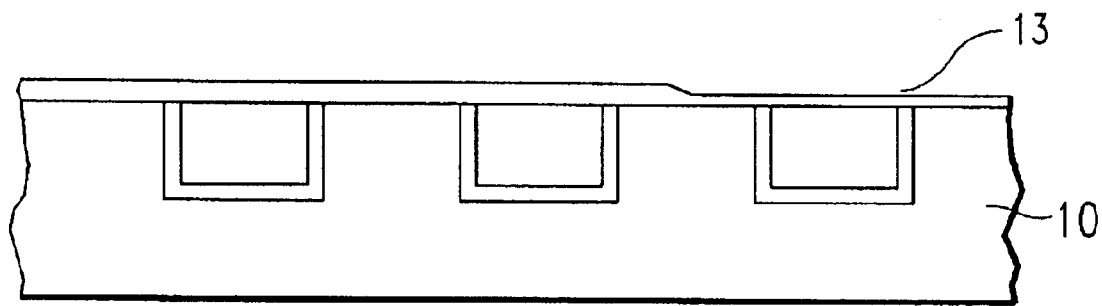

Barrier layer 13 is then smoothed by CMP to provide a smooth surface for magnetoresistive metal stack deposition. However, non-uniform polish rates often result in thickness variation in the remaining barrier layer 13, as shown in FIG. 2(d). When barrier layer 13 is subsequently etched, some portions of barrier layer 13 may be underetched resulting in shorts between conductors, while other portions of barrier layer 13 may be overetched resulting in destruction of the underlying dielectric layer 10.

Figure 2E:
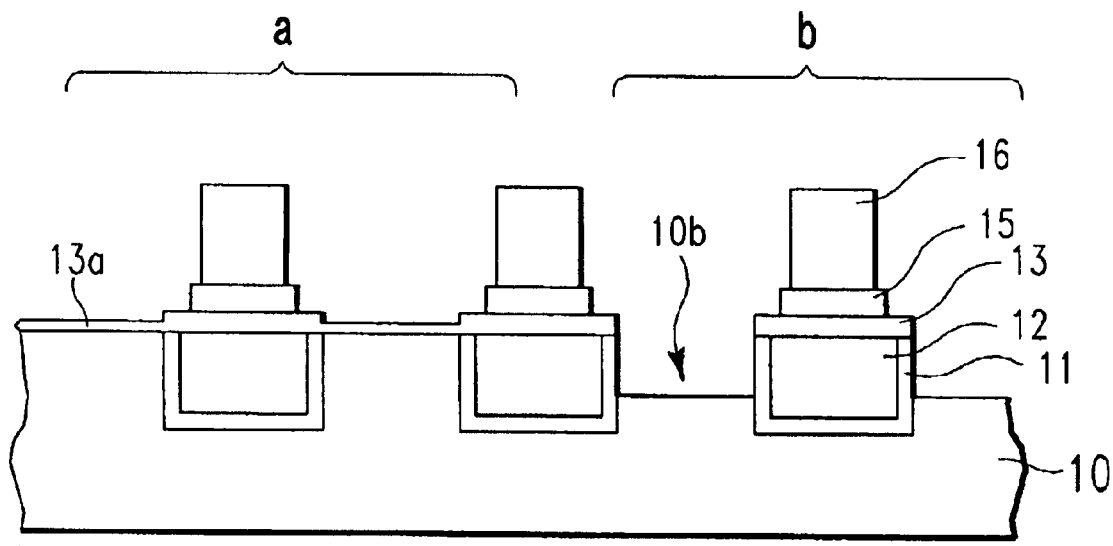

These problems can be seen in FIG. 2(e), which shows the partially-fabricated metal stack after barrier layer 13 is etched, the remaining metal stack layers (collectively shown as layer 15) are deposited, and metal mask 16 is used to etch barrier layer 13 and the additional metal stack layers 15 in areas exposed by mask 16 using a lithographic process. In area a of the partially-fabricated metal stack shown in FIG. 2(e), barrier layer 13 is too thick following CMP and is therefore incompletely etched, leaving barrier material 13a which will cause shorts between conductors. In area b of FIG. 2(e), barrier layer 13 is too thin following CMP and is therefore overetched, resulting in removal of dielectric material 10 from between the conductors. In addition, roughness in the surface of polished conductor 12 may be translated to the interface between the tunnel barrier layer and the magnetic layers, resulting in the interfacial roughness 7 shown in FIG. 1.

Figure 3A:
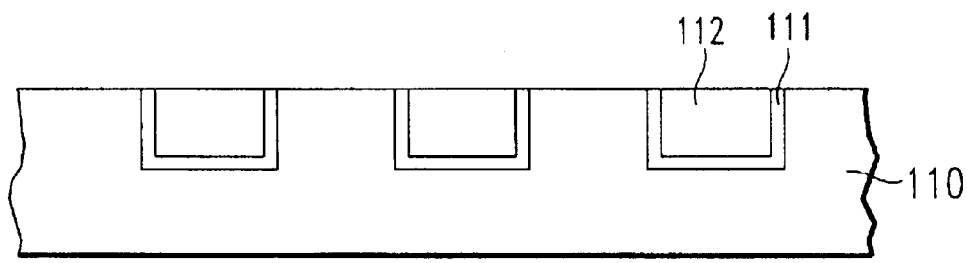
FIGS. 3(a)–3(d) illustrate a method for forming a MRAM cell in accordance with a preferred embodiment of this invention.
Figure 3B:
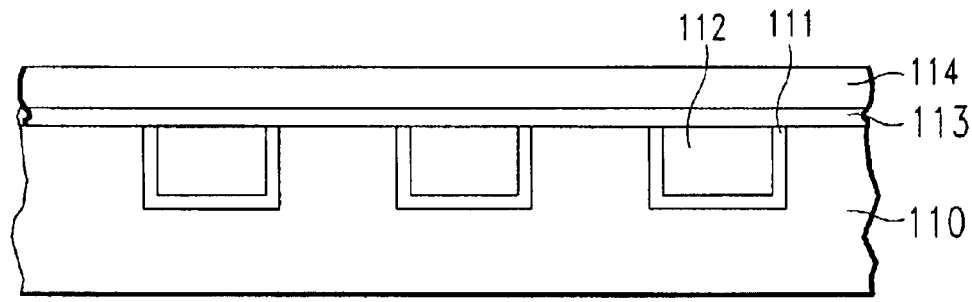

These problems associated with polishing of the conductor and barrier layers are alleviated by use of the method of the present invention. One embodiment of the method is shown in FIGS. 3(a)–3(d). In FIG. 3(a), conductors 112 have been formed in dielectric material 110. Between conductors 112 and dielectric material 110, a liner 111 is typically disposed. Following planarization of conductors 112 by CMP, a first barrier layer 113 is blanket deposited, and then a second barrier layer 114 is blanket deposited over first barrier layer 113.

First barrier layer 113 is preferably formed of a material different from second barrier layer 114. More preferably, first barrier layer 113 has a significantly slower polish rate than second barrier layer 114 resulting in a polish selectivity with respect to first barrier layer 113. In other words, first barrier layer 113 preferably has a polish rate of about 200 to 300 angstroms/min., and second barrier layer 114 preferably has a polish rate of about 800 to 1200 angstroms/min., resulting in a polish selectivity of about 1:4.

The material for first barrier layer 113 should also be selected such that a very smooth surface is obtained upon polishing. In a preferred embodiment, first barrier layer 113 is TaN, and second barrier layer 114 is Ta. In another embodiment, first barrier layer 113 may be TiN deposited by chemical vapor deposition (CVD), and second barrier layer 114 may be TiN deposited by physical vapor deposition (PVD).

The preferred CMP conditions used to achieve the differential polish rates described above are as follows: downforce about 1 to 5 psi, table rotation rate about 30 to 80 rpm, carrier rotation rate about 30 to 80 rpm. Polish pads IC1000™ on SubaIV™, or IC1000™ on IC1000™ K-grooved (trademarks of Rodel, Inc.) may be used with a commercially available silica abrasive slurry.

Figure 3C:
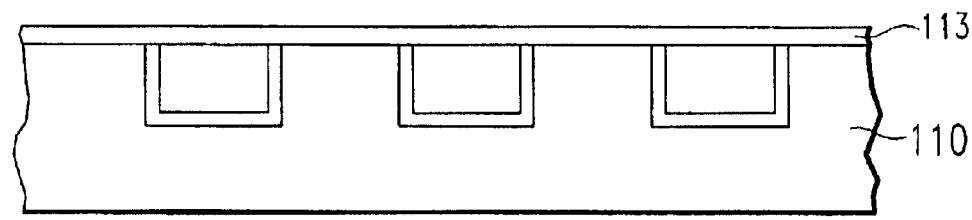
Figure 3D:
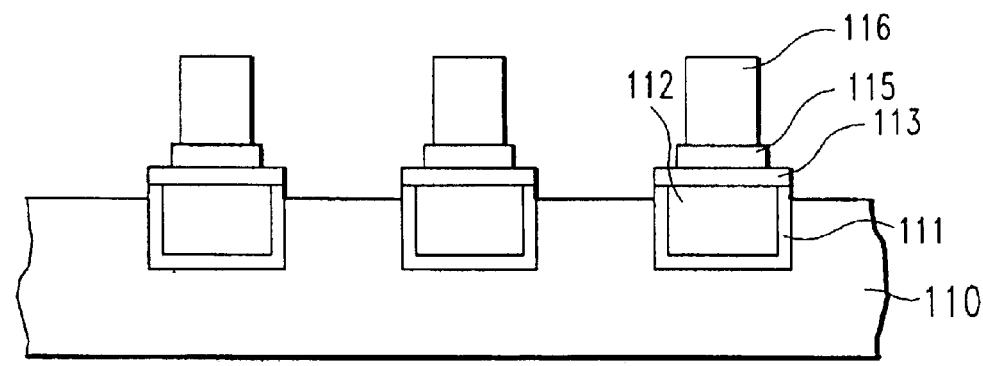

In FIG. 3(c), second barrier layer 114 is essentially removed by polishing using CMP, exposing first barrier layer 113 and creating a very smooth surface on first barrier layer 113. It is preferable to remove completely the second barrier layer 114 while leaving at least a portion of the first barrier layer 113. In FIG. 3(d), metal stack layers 115 are deposited on barrier layer 113, and metal stack layers 115 and barrier layer 113 are removed by etching in areas exposed by metal mask 116 using a lithography process. Because barrier layer 113 is polished uniformly, there are no areas where barrier layer 113 is underetched thereby causing shorts between conductors 112, and there are no areas where barrier layer 113 is overetched thereby removing too much dielectric material 110. Moreover, because barrier layer 113 is polished to a very smooth finish, interfacial roughness is not present at the interface between the tunnel barrier layer and the magnetic layers in metal stack 115, thereby eliminating the Neel coupling problem discussed above.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method for fabricating a magnetoresistive random access memory cell, comprising the steps of:
    providing a semiconductor substrate including at least one conductor embedded in a dielectric material, the top surface of said conductor being coplanar with the top surface of said dielectric material;
    depositing a first material on said conductor and said dielectric material;
    depositing a second material on said first material, wherein said second material has a polish rate different from said first material;
    essentially removing said second material by chemical mechanical polishing;
    depositing a first magnetic layer, a non-magnetic tunnel junction barrier layer, and a second magnetic layer; and
    patterning said first material, said first magnetic layer, said non-magnetic tunnel junction barrier layer, and said second magnetic layer by a lithographic process.

2. The method of claim 1, wherein said first material is tantalum nitride and said second material is tantalum.

3. The method of claim 1, wherein said first material is titanium nitride and is deposited by a chemical vapor deposition process, and said second material is titanium nitride and is deposited by a physical vapor deposition process.

4. The method of claim 1, wherein said conductor is formed of copper.

5. The method of claim 1, wherein said substrate further includes a liner material disposed between said conductor and said dielectric material.

6. The method of claim 1, wherein said second material is removed by chemical mechanical polishing at a rate about 4 times the removal rate of said first material.

7. The method of claim 1, wherein said chemical mechanical polishing is performed using a downward force of about 1 to 5 psi, a table rotation rate of about 30 to 80 rpm, and a carrier rotation rate of about 30 to 80 rpm.

8. The method of claim 1, wherein said second material is removed by chemical mechanical polishing at at rate of about 800 to 1200 angstroms/minute.

9. The method of claim 1, wherein a portion of said first material is also removed by said chemical mechanical polishing.

10. The method of claim 9, wherein said first material is removed by chemical mechanical polishing at a rate of about 200 to 300 angstroms/minute.

\* \* \* \* \*